(12) United States Patent
Kiat et al.

(10) Patent No.: US 6,250,318 B1
(45) Date of Patent: Jun. 26, 2001

(54) METHOD AND APPARATUS FOR WASHING AND DRYING SEMI-CONDUCTOR DEVICES

(75) Inventors: Ho Boon Kiat; Chua Hui Che, both of Singapore (SG)

(73) Assignee: Ultra Clean Technology Asia Pte. Ltd., Paya UBI Industrial Park (SG)

( * ) Notice: Subject to any disclaimer, the term of this patent is extended or adjusted under 35 U.S.C. 154(b) by 0 days.

(21) Appl. No.: 09/248,813

(22) Filed: Feb. 11, 1999

(30) Foreign Application Priority Data

Oct. 2, 1998 (SG) .................................................. 9803976

(51) Int. Cl.⁷ ............................................................ B08B 3/02
(52) U.S. Cl. ..................... 134/72; 134/64 R; 134/131; 134/68; 134/122 R; 134/902; 239/553; 239/566; 239/590
(58) Field of Search ................................... 134/64 R, 72, 134/129, 127, 131, 68, 122 R, 902; 239/553, 556, 553.5, 557, 562, 394, 395, 566, 536, 587.5, 269, 392, 393, 547, 546, 451, 550, 554, 558, 590, 543, 587.6, 559

(56) References Cited

U.S. PATENT DOCUMENTS

| | | | |
|---|---|---|---|
| 535,669 | * | 3/1895 | Burt . |
| 3,010,692 | * | 11/1961 | Jentoft . |
| 3,421,211 | * | 1/1969 | Eaves et al. ............................ 134/72 |
| 3,868,272 | * | 2/1975 | Tardoskegyi ........................... 134/72 |
| 4,073,663 | * | 2/1978 | Lundgren ................................ 134/72 |
| 4,085,171 | * | 4/1978 | Baker et al. . |
| 4,766,916 | * | 8/1988 | Bowden ............................... 134/131 |
| 4,805,649 | * | 2/1989 | Nezworski ............................. 134/72 |
| 4,919,336 | * | 4/1990 | Hudon et al. . |
| 5,095,930 | * | 3/1992 | Stroszynski et al. . |
| 5,103,846 | * | 4/1992 | Clark et al. ............................. 134/72 |
| 5,293,888 | * | 3/1994 | Avelis et al. ............................ 134/68 |
| 5,334,352 | * | 8/1994 | Johnson . |
| 5,614,264 | * | 3/1997 | Himes ................................. 134/64 R |
| 5,660,196 | * | 8/1997 | Bein ..................................... 134/129 |
| 5,843,516 | * | 12/1998 | Derbenwick et al. . |
| 5,850,841 | * | 12/1998 | Han et al. . |

* cited by examiner

Primary Examiner—Frankie L. Stinson
(74) Attorney, Agent, or Firm—Christie, Parker & Hale, LLP

(57) ABSTRACT

A cleaning apparatus which comprises a spray cleaning arrangement capable of even cleaning of devices. The cleaning arrangement is disposed within a housing, and is directed towards a conveyor belt, which transports the device to be cleaned across the various wash, rinse and drying zones of the apparatus. At least one spray wand is provided for the circulation of a wash fluid having at least one row of holes disposed longitudinally thereacross for releasing the wash fluid onto the device to be washed. The spray wand has a decreasing internal traverse cross-sectional area from one end to the second end such that a substantially uniform internal pressure is maintained between the two ends during washing. The holes on the spray wands are preferably microtunnels which can be disposed at high density along the spray wand. The spray wand can also be rotated such that the direction of spray may be adjusted. The various wash, rinse and drying zones are ideally designed as modules with their own conveyor belts, such that contamination due to fluid carry-over is minimized. A top guiding system is also provided directional control to the moving devices.

28 Claims, 17 Drawing Sheets

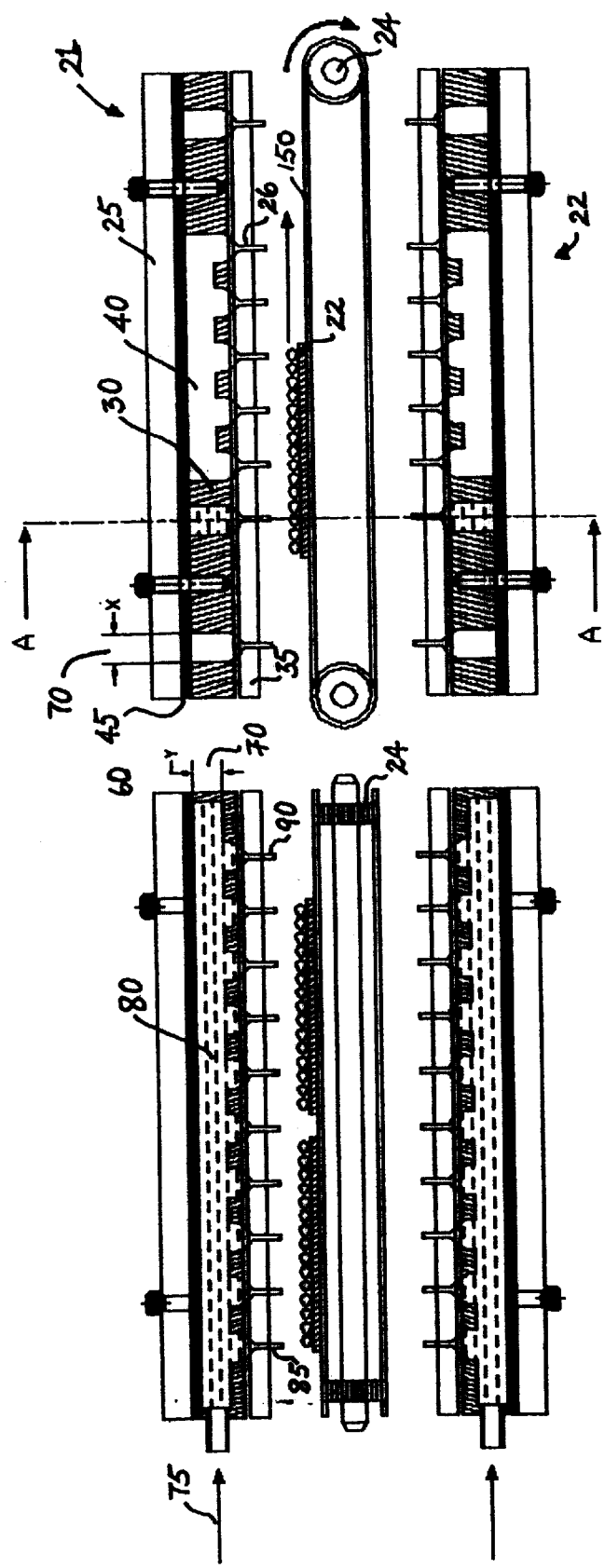

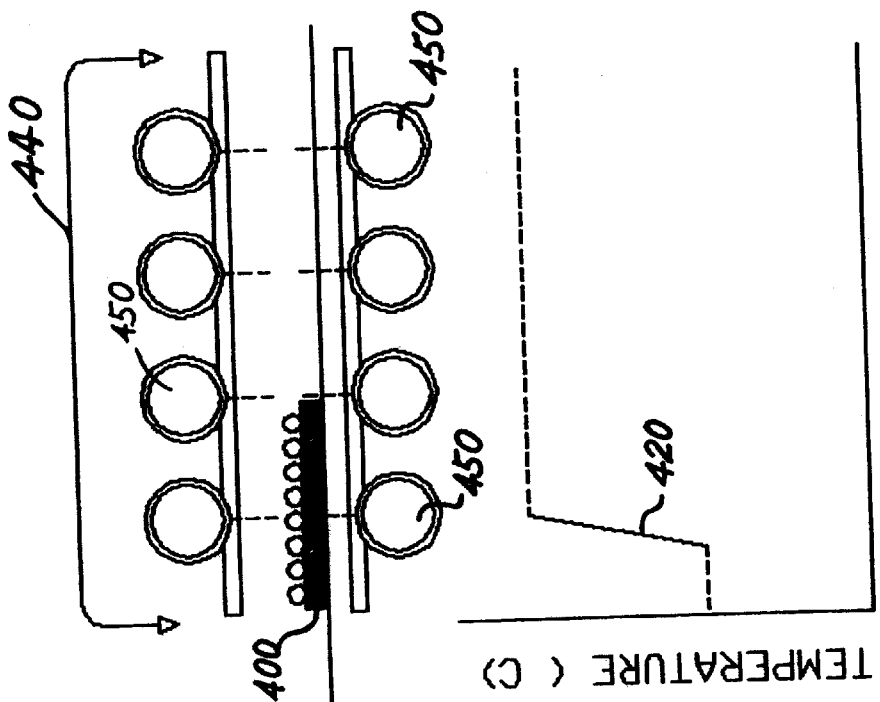
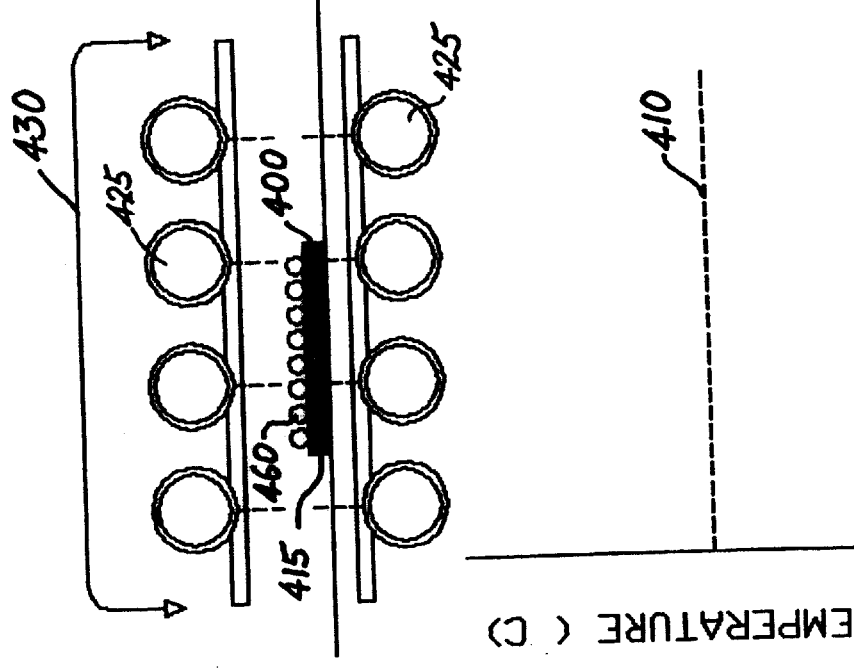

$Fx = FtSin\theta_1 + FbSin\theta_1$ $Fy = FbCos\theta_2 - FtCos\theta_2$

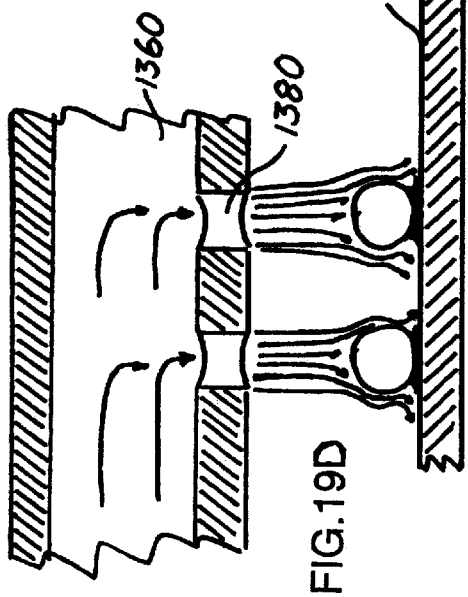
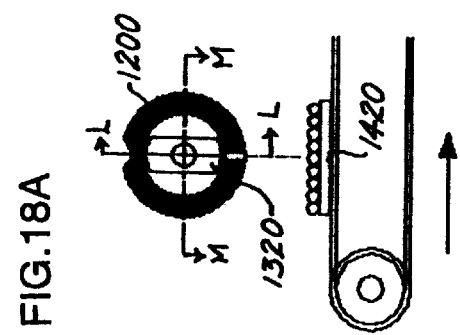
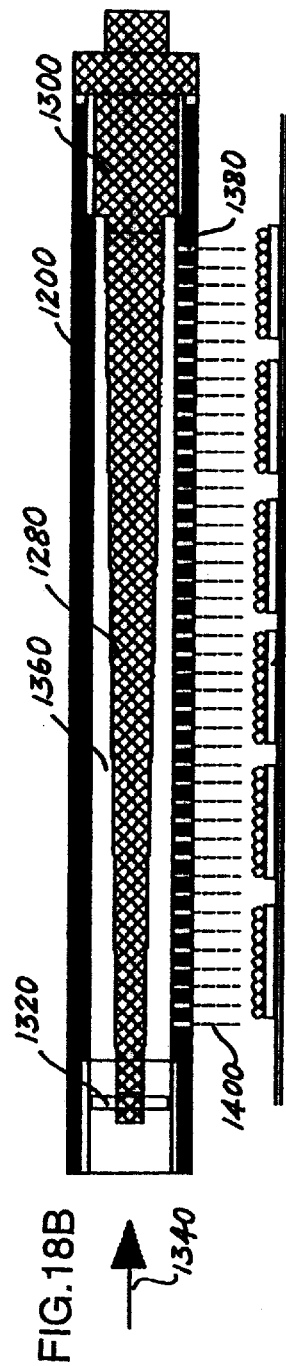
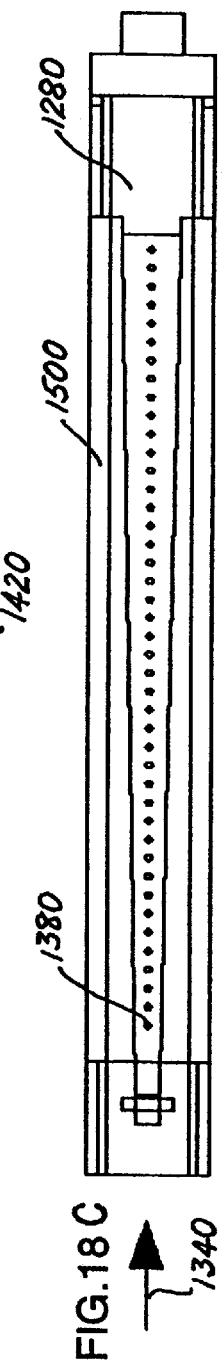

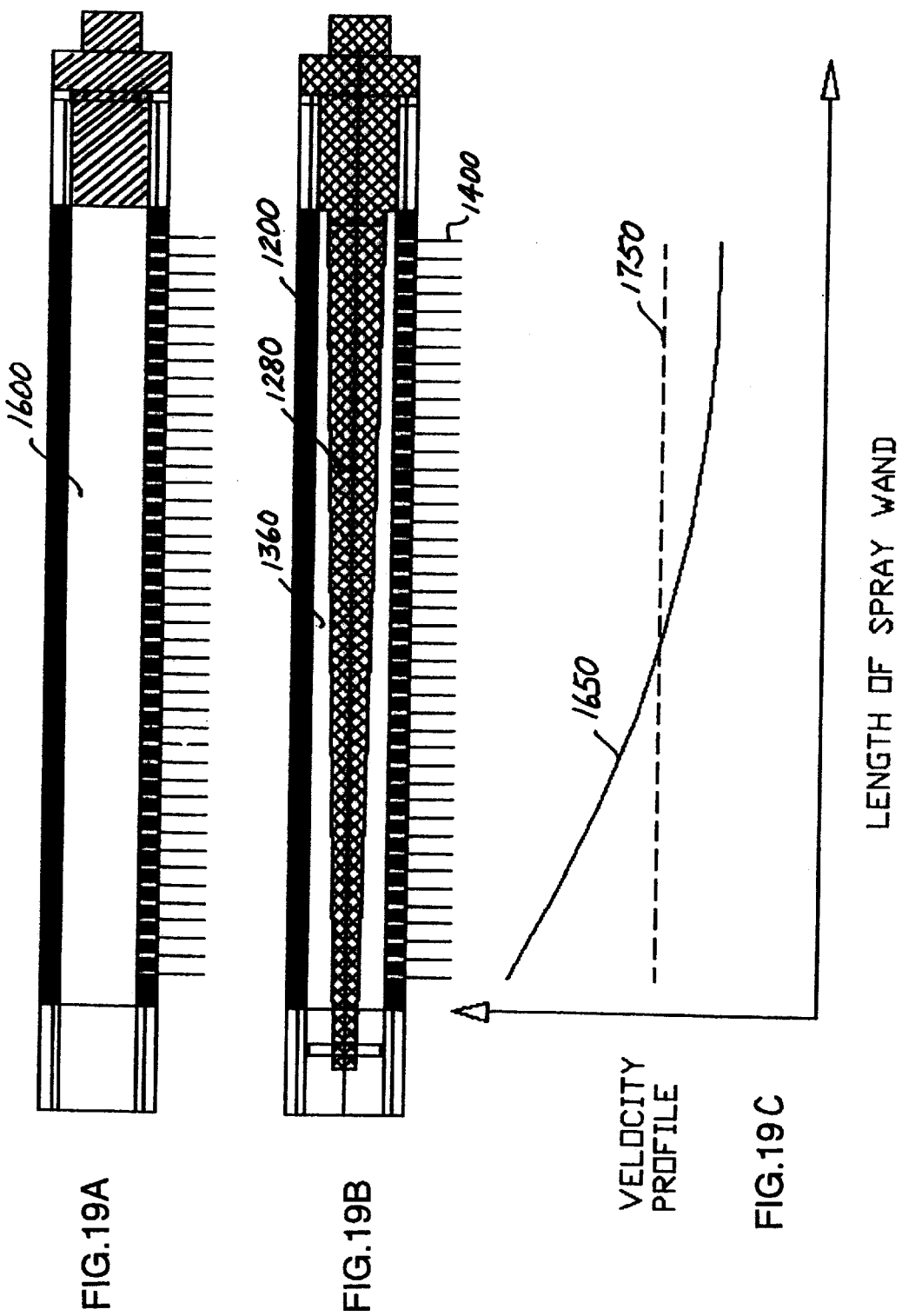

METHOD AND APPARATUS FOR WASHING AND DRYING SEMI-CONDUCTOR DEVICES

FIELD OF THE INVENTION

The present invention is related to washing apparatus and method of using the same. In particular, the present invention is related to a method and apparatus for cleaning and drying of semi-conductor devices.

BACKGROUND OF THE INVENTION

The art of cleaning generally consists of multiple zones of treatment; namely, a wash zone, a rinse zone and a dry zone. The wash zone typically contain a prewash section, a wash section and an air isolation section. In addition, there is a rinse section which typically includes a first rinse section to wash away the chemical from the wash section, a rinse section, a final rinse section and an isolation section. The final drying section generally contains an air isolation section, and the heated air dry section. A central exhaust system located at the top of the entire apparatus acts to extract fumes generated from the washing actions, which are extracted by the central exhaust blower external to the cleaning apparatus. There is also a conveyor transport system which runs across the entire length of the various zones of treatment. This conveyor carries the device to be cleaned and moves the devices through the various treatment zones for cleaning and drying.

Cleaning equipment in the art generally include commercial spray nozzles attached to a spray manifold or hose, and held across the path of the device to be washed and cleaned. These nozzles are usually very large and bulky in diameter and provides various types of spray cones and angles of discharge (see angle α as shown in FIG. 3). When these nozzles are attached across the spray manifold or hose, they cannot achieve close pitching when attached in a straight line. Thus a spray angle coverage is the only means by which these spray nozzles reach the entire surface of the devices to be cleaned. This spray angulation causes the edges of the devices to experience a decrease in fluid energy as in the decrease of mass momentum of fluid motion. Advancement in miniaturization of semi-conductor chips with the creation of micro-ball grid area packages and chip scale packages has seen the input-output interconnect leads being replaced by solder balls, with a pitch of around 1.0 to 1.5 mm. With the bulky size of the spray nozzles, cleaning of such closely packed devices become ineffective.

Conventional spray manifold and hoses have angled spray jets which have a direction of spray perpendicular to the conveyor belt (see angle θ in FIG. 17) i.e. direction of spray of 0°. With respect to the vertical axis as shown in line 888 in FIG. 17A. These types of design limits the cleaning parameters which are much needed to enhance cleaning actions. When angled spray jets with a 0° direction of spray are used to clean parts having very light weight, such as a plastic ball grid array (BGA) strip, the mesh-type conveyor belt which is suppose to transport the strip across the various zones may not function effectively. The sandwich effect of a strong top and bottom spray at high velocity and pressure may pin the device at a stationary position due to slippage relative to the belt. This problem is compounded by the fact that most semi-conductor packages are cleaned in the"dead-bug" position, with the plastic packaging in contact with the conveyor mesh. Due to the low coefficient of friction between the plastic and the mesh-type conveyor belt, slippage is aggravated. When the package slips and travels inconsistently, the travel time and spray contact time (i.e. cleaning time) becomes inaccurate. This results in loss of yield and cleaning efficiency of the conventional equipment.

Conventional spray manifold and hoses also use a fixed tunnel width and height design with specially customized nozzles. Physical principles dictate that a severe pressure drop would result across these conduit, resulting in a significant drop in velocity of the sprays which are directly proportional to the distance from the fluid source.

Conventional in-line cleaning equipment are also known to provide notched conveyors, which provide lane guiding to prevent lateral movement of the devices along the conveyor belt. The notches, however, are limiting when the type of devices to be cleaned is changed during batch production because of the amount of time needed to completely change to a different. type of belt with different notch spacing to accommodate the varying package sizes. Dedicated notch conveyor is also termed bottom guiding conveyor for multi-lane strips cleaning, and is also very difficult to convert when the size, of the semi-conductor package change during actual production.

The conveyor systems in cleaning apparatus as known in the art are also designed with one belt spanning the various zones of cleaning. Fluid tends to remain on the conveyor mesh after cleaning, and takes time to dislodge by gravity. The time to dislodge the adhering fluid is often longer than the time it takes for a device to move across zones. Thus the prior art design permits carry-over of fluids from one cleaning zone to the next, resulting in cross-contamination.

The conveyor belts in the art are commonly of a cross mesh-type which gives the advantage of ease of tension without gears. However, the cross meshes have the disadvantage of creating shadows on the devices to be cleaned. This means that some portions of the devices are inaccessible for cleaning due to the physical presence of the cross mesh.

Present in-line cleaners are also prone to variable cleaning effectiveness due to load variation. When the load increases due to production throughput, and enters the cleaning apparatus in a staggered or random manner in their respective lanes, the dynamic load will reduce the conveyor speed. The speed of such conveyors is inversely proportional to the total weight of the load. This results in uneven cleaning time and subjects the devices to non-uniform parameters of cleaning, affecting the yield of the cleaning equipment.

Prior art cleaning technology in general make little effort to control fluid consumption and prevent loss of cleaning fluid. Typically, the wash fluid is allowed to find its own path towards a drip tray collecting device. However, due to the carry-over effect mentioned previously, and a lack of features designed for conservation, fluid recovery is left to chance, and wash fluid is often allowed to dissipate into the exhaust system or into the next zone. Poor recovery of fluid results in high operating costs.

OBJECT OF THE INVENTION

It is therefore an object of the present invention to provide a system to overcome the shortcomings as stated above.

It is another object to provide a cleaning apparatus which gives high and consistent cleaning efficiency.

It is a further object to provide a cleaning apparatus which has a low operating cost.

SUMMARY OF THE INVENTION

According to the objects of the invention, there is provided a cleaning apparatus which comprises spray cleaning means capable of even cleaning of devices. The cleaning means is disposed within a housing, and is directed towards a conveyor system, which transports the device to big cleaned across the various wash, rinse and drying zones of the apparatus. According to one aspect of the invention, at least one spray wand is provided for the circulation of a wash fluid having at least one row of holes disposed longitudinally thereacross for releasing the wash fluid onto the device to be washed. The spray wand has a first and second end. The first end of the spray wand is adapted for attachment to a source of fluid supply. The spray and has a decreasing internal traverse cross-sectional area from the first to the second end such that a substantially uniform internal pressure is maintained between said first and second end during washing.

In another aspect of the present invention, the holes on the spray wands are microtunnels which can be disposed at high density along the spray wand. The microtunnels are straight channels which have a minimum angle of spray such that efficient laminar fluid momentum energy is derived. This is particularly important for applications such as precision cleaning of semi-conductor devices. The spray wand can also be rotated such that the direction of spray may be adjusted. In a further aspect of the present invention, the spray wand may be manufactured in sections, such that different sections may have different directions of spray. In yet a further aspect of the present invention, the drying zone provides for gradual heating of the devices followed by gradual cooling, such that temperature shock is minimized. The various wash, rinse and drying zones are ideally designed as modules with their own conveyor belts, such that contamination due to fluid carry-over is minimized. A top guiding system is also provided for directional control to the moving devices. Gaps between the top guide and the conveyor belt can be varied with height adjustment mechanisms.

BRIEF DESCRIPTION OF THE DRAWINGS

FIG. 1 is a side cross-section elevational view of a prior art manifold with dedicated nozzles having direction of spray of 90°.

FIG. 2 is a front cross sectional view of a prior art fixed width conduit manifold with dedicated nozzles.

FIG. 5 is a side cross sectional view of a prior art air drying section.

FIG. 6 is a temperature profile experienced by a device as it moves through zone 430.

FIG. 7 is a temperature profile experienced by a device as it moves, through zone 440.

FIG. 18A is a traverse cross sectional view of a spray wand at the first end according to the same embodiment of the present invention.

FIG. 18B and C are longitudinal cross-sections of a spray wand cut across lines L—L and M—M respectively.

FIG. 19C is a graph of the velocity fluid discharge from a prior art conduit (FIG. 19A) and a spray wand according to the present invention (FIG. 19B).

DESCRIPTION OF THE INVENTION

Figure 3:
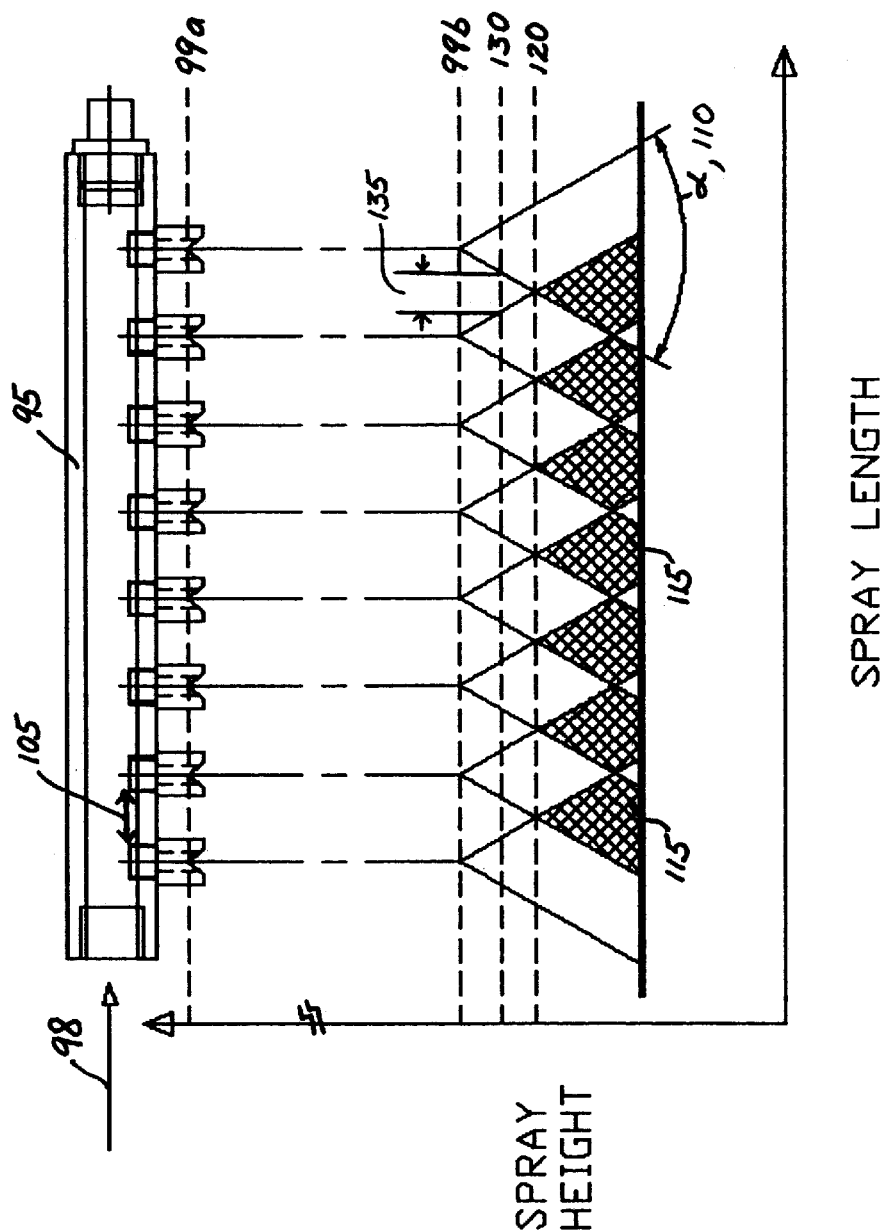
FIG. 3 is a front cross sectional view of a prior art apparatus showing the spray angle and area of coverage of the spray nozzles.

An apparatus for achieving state-of-the art cleaning is described. The preferred embodiment comprises a conveyor disposed within a housing or chassis, and a set of spray tools. A pump system delivers pressurized fluid from tanks to strainer, valves, filters and/or ion exchange resins to finally exit through spray tunnels or wands onto the devices to be cleaned. The spray tools can be grouped into one or more sections, such as a wash, rinse, and drying sections.

The prewash or wetting spray wand in the wash section preferably function with chemicals or water as the wash fluid or medium, followed by a series of wash sprays, and ends with an isolation process, which prevents the wash medium from crossing over to the next rinsing stage. The pre-rinse spray wand removes the chemical on the devices from the wash section, followed by a series of spray wands which washes completely the remaining in residue from the device. Another isolation spray wand which uses for example nitrogen gas, is used to prevent rinse fluid from entering the next section and also to isolate the rinse fluid from the drying section. The rinse fluid is ideally collected and drains directly to a water treatment system for recycling. The third section is the drying section, which comprises a drying system disposed within a dry zone. The drying system preferably allows gradual heating by blowing air of ambient temperature to flash temperature, e.g. 200° C. to dry the devices. Even more preferably, the drying system also allows for the gradual lowering of temperature before the devices leave the drying zone.

In the following description, a preferred embodiment will be described first as a complete apparatus to illustrate the inter-relationship and significance of the various features. This is followed by detailed descriptions of the most important features, such as the adjustable angle, adjustable top guiding system, the uniform velocity spray wand, and the fluid pressure control system. Numerous details of the cleaning apparatus are described in order to provide a thorough understanding of the features of the present invention. In other instances, well known elements such as the conveyor motor and external fluid supply are not described in detail in order not to unnecessarily obscure the present invention. It will be come obvious to one skilled in the art that these specific details are for illustration only, and are not intended to limit the scope of the invention as set forth in the claims.

FIG. 1 is a side cross sectional view of a prior art spray manifold 21 which delivers spray fluid to devices 22 to be cleaned. The devices are placed on a crossed meshed steel belt 150 of a conveyor transporter 24. The spray manifold assembly 21 comprises rows of micro spray nozzles 26 inserted into the spray manifold assembly 21 and protrudes from the bottom nozzle guide plate 35. As can be easily seen, when the device 22 is a semi-conductor ball grid array package with closely packed balls, this type of spray gangs hinder the movement of the ball leads and tend to create jamming problems when the force of the bottom spray is stronger than the top spray. The distance between the nozzles and the device also cannot be too short, as conventional nozzles protrude from the manifold or conduit. The spray manifold assembly in the art also requires that the manifold assembly be built from many plates, such as top plate 25, internal fluid channel plate 30, and bottom nozzle plate 35 due to manufacturing of the spray fluid internal chamber 40 to accommodate the micro spray nozzle 26. The entire multiple-plate assembly is then connected using screws to form the spray manifold assembly. In addition, a fluid sealing gasket 45 is needed to provide a leak free fluid internal chamber 40 between the top plate 25 and the fluid channel plate 30. It is also evident that the direction of spray (as shown by angle θ in FIG. 17) cannot be adjusted as the micronozzles 26 are embedded internally into the spray manifold assembly 21. Therefore, conventional spray nozzles usually have a 0° direction of spray as shown in FIG. 1.

FIG. 2 is a front cross sectional view of a prior art manifold 60 with dedicated nozzles. The conduit has a fixed cross sectional area 70 which results in a pressure drop across the length of the conduit when the fluid is introduced from one side 75 of the spray channel 80. Due to the arrangement of the nozzles across its length. The spray fluid pressure drop is related to its discharge velocity. Thus by maintaining conduit with a fixed traverse cross-sectional area 70, the velocity of fluid discharge from the nearest nozzle 85 to the farthest nozzle 90 will be reduced. Such uneven mass flow is undesirable for precision cleaning such as required for semi-conductor devices.

FIG. 3 is a front cross sectional view of a prior art spray mechanism with a graphic spray angle illustration. This spray mechanism uses conventional nozzles 100 directly attached to the spray conduit 95 to produce spray jets of fluids entering in the direction of arrow 98. The spray discharge lines 99 indicates the exit point where the spray jets diverges. (for ease of illustration, the actual spray discharge line 99a is redrawn as line 99b in FIG. 3) The conventional nozzles 100 has a physical size which limits the geometry of pitching 105 needed to clean small semi-conductor devices. The large angle of spray 110 also results in a high vertical height needed so that all the areas of the devices can be cleaned. This large angle also creates uneven fluid momentum which varies from the center of the spray to the outer angle of the spray. This effect will cause the device to have better cleaning at the center compared to the spray edges. The high velocity height also result in loss of chemical through atomization at the nozzle orifice, and can result in huge losses of cleaning chemicals through vaporization through the system exhaust uptake. The spray cone angle α 110 is also hard to control and can cause cross interference 115 with the spray jets from adjacent sprays. The cross interference 115 in effect creates zones of turbulent flow and will not provide laminar fluid flow needed for effective cleaning. By adjusting the height of the spray jets to height line 120, one may reason that the optimal surface are coverage can be obtained. However, due to pressure drop across the conduit as mentioned above, the spray cone angle cannot be controlled uniformly in practice, irrespective of the height of the spray jet. For the spray jets positioned nearer to the device as in height line 130, the spray coverage with be poor since gaps 135 with no spray fluid would result.

Figures 4A, 4B:
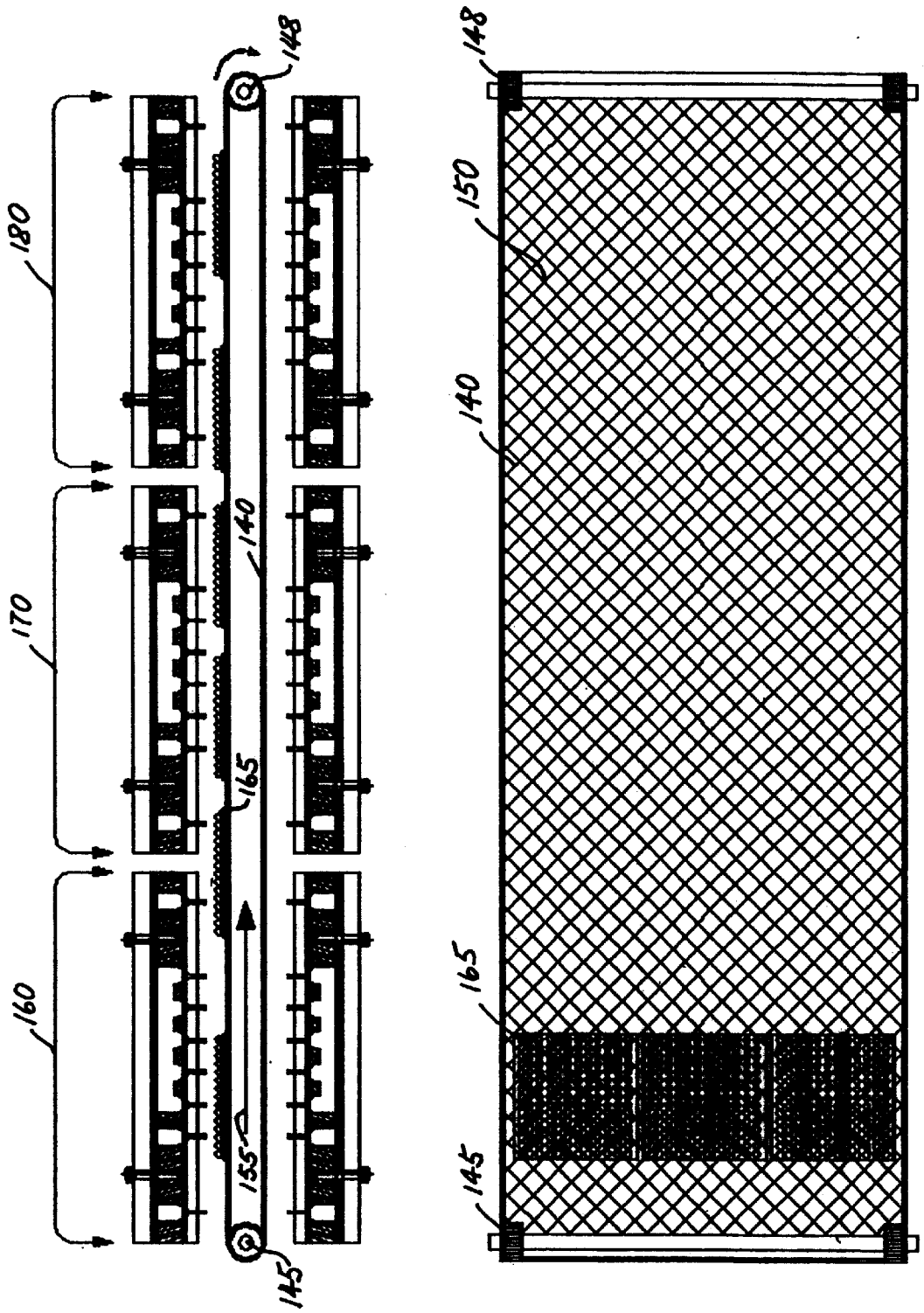
FIG. 4A is a side cross sectional view of a prior art apparatus with a single conveyor belt.
FIG. 4B shows the top view of the single conveyor cross-mesh belt in FIG. 4A.

FIG. 4 is a side cross sectional view of a prior art apparatus with a single piece cross mesh continuous conveyor belt connected by drive shafts 145 and driven by drive sprockets 148. This type of cleaning apparatus using cross meshed conveyor belt 140 creates shadow effects whereby the areas of the devices directly underneath the steels wires 150 are not directly sprayed by the cleaning fluid. In addition, the single belt configuration facilitates fluid carry over from the wash zone 160 to the rinse zone 170 to the dry zone 180. This causes contamination of the rinse fluid, and results in reduced life-span of chemical in the rinse tank. In this illustration, the device 165 to be cleaned travels in direction 155 from left to right.

Figure 8:
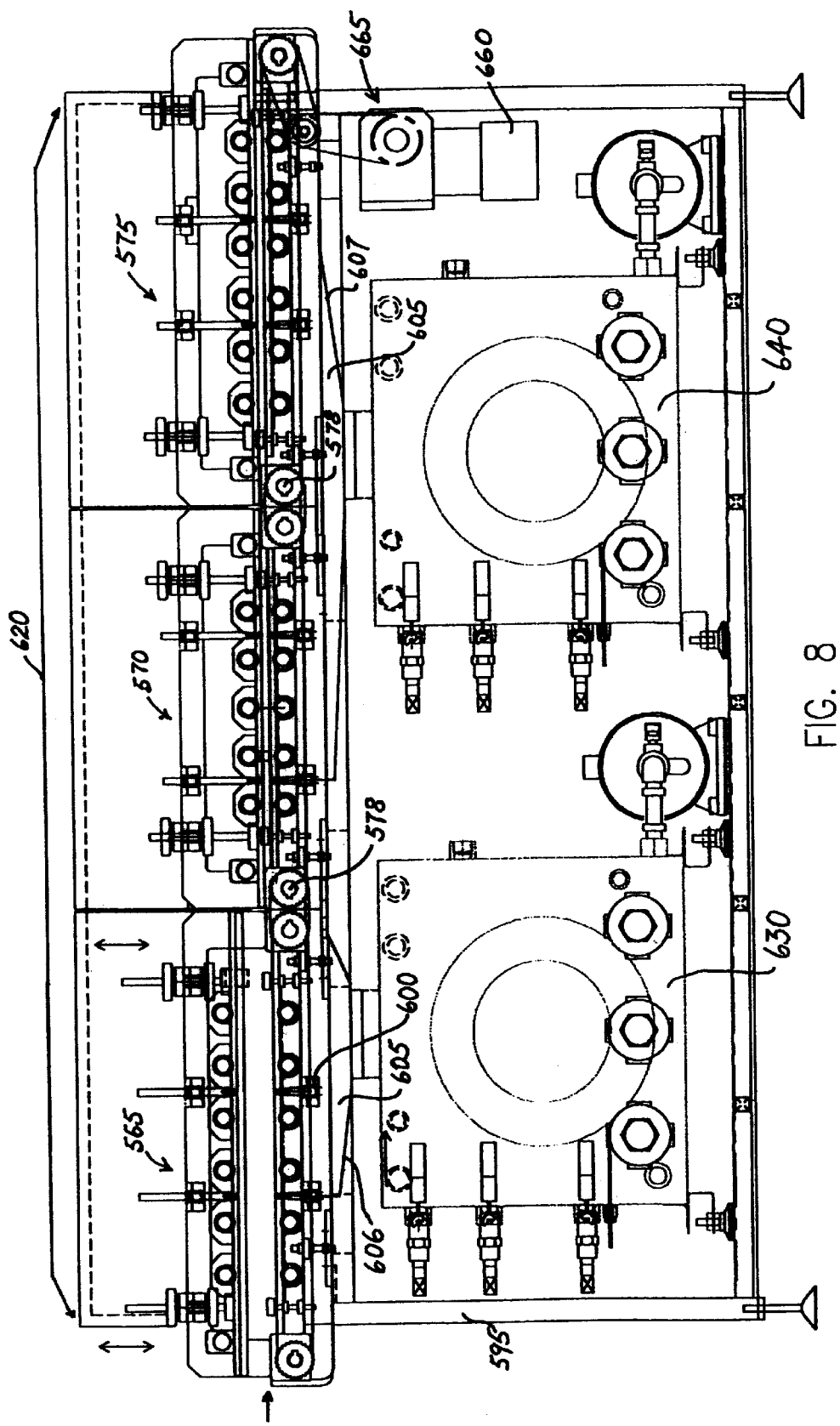
FIG. 8 is a side elevational view of an embodiment of the present invention.

FIG. 5 is a side cross sectional view of a set of prior art rinse spray wand 425 and drying air knives 450 which lacks thermal profiling control, resulting in sudden temperature changes as the device moves from the rinse zone to the dry zone. FIGS. 6 and 7 shows the semi-conductor packages 400 being subjected to thermal spike 420 as the packages move from the rinse spray section 430 to the heated dry air spray zone 440. For a typical apparatus for cleaning semi-conductor packages, the temperature difference may be from 70° C. (as indicated by line 410 in FIG. 6) to 180° C. (as shown by spike 420 in FIG. 7). This thermal spike 420 will subject the device 400 to a sudden steep thermal shock and may cause a high temperature differential between device leads 460 and its package body 415 thereby resulting in separation of the leads 460 from device package body 415. FIG. 8 is a side cross sectional view of an embodiment of the present invention. If comprises three modular sections : wash section 565, rinse section 570 and drying section 575. The modules are interchangeable, and can easily be rearranged to allow other configurations and cleaning regiment, or for devices to be cleaned from either right to left or left to right without any physical modifications to the three sections. In this example, the device 580 to be cleaned and dried is transported from the front end on the left and enters the wash 565, rinse 570 and drying 575 zones sequentially, and eventually exits the back end of the cleaning apparatus on the right. It would be obvious to one skilled in the art that by re-orienting the wash zone 565, the front end would appear on the right and the dry zone 575 and back end would appear to the left. The three modular sections 565, 570 and 575 are mechanically linked to chassis 595 through attachments 600, and sits on top of a fluid collection tray 605 which is also attached to chassis 595. The linking may be achieved, for example with chain and sprocket mechanism 578, with the rotary motion of the conveyor, shaft and motor assembly powered by a speed controllable drive motor 660 through chains 665, idler sprocket 670 and tensioner sprocket 680. This ensures that all three modular conveyors are driven with a synchronized speed from the drive motor 660.

In this embodiment, the fluid collection tray 605 is a single multiple partition tray which spans the entire length of the cleaning and drying zones 620. The various partitions allow the respectively fluids to be channeled back to the respective tanks. Thus the wash fluid may be channeled to the bottom wash tank 630 via the wash fluid tray section 606. Similarly, the rinse fluid is channeled to the bottom rinse tank 640 via the rinse fluid tray section 607.

Figure 9:
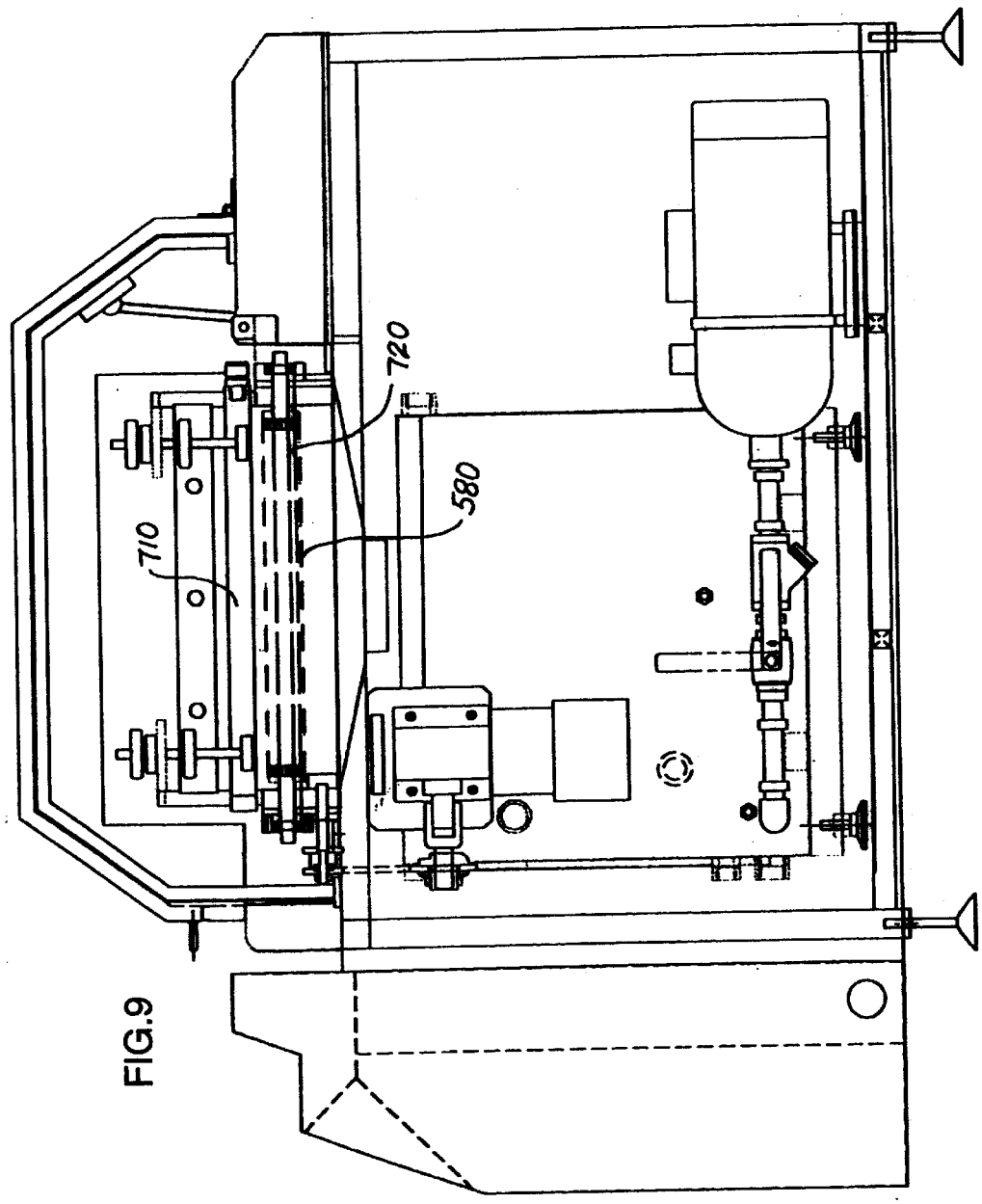
FIG. 9 is a front sectional view of the various features of the same embodiment of the present invention.

FIG. 9 is a front cross sectional view of the same embodiment of the present invention. It shows the physical locations of the top spray wands 710 and bottom spray wands 720 disposed across the path of the conveyor belt transporting device 580. The bottom spray wands 720 of the wash, rinse and drying sections are positioned between the bottom continuous conveyor belt sprockets diametric space.

Figure 10B:
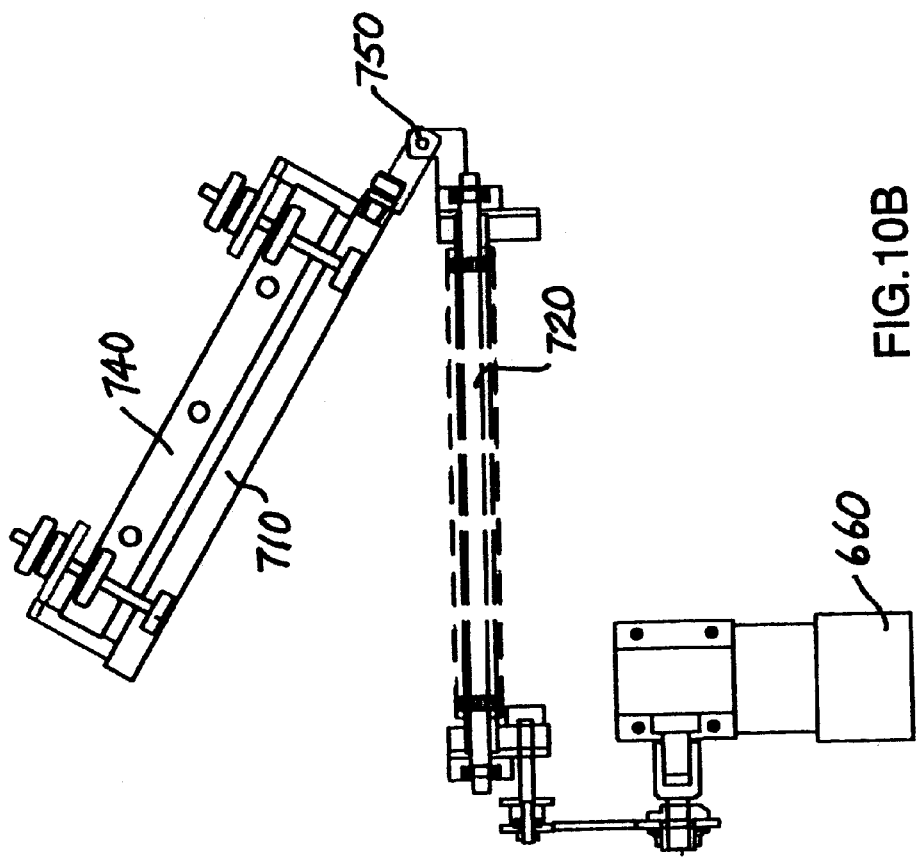
FIG. 10 is a front sectional view of the hinged spray section of the same embodiment of the present invention with the lid in the closed (FIG. 10A) and open (FIG. 10B) position.
Figure 10A:
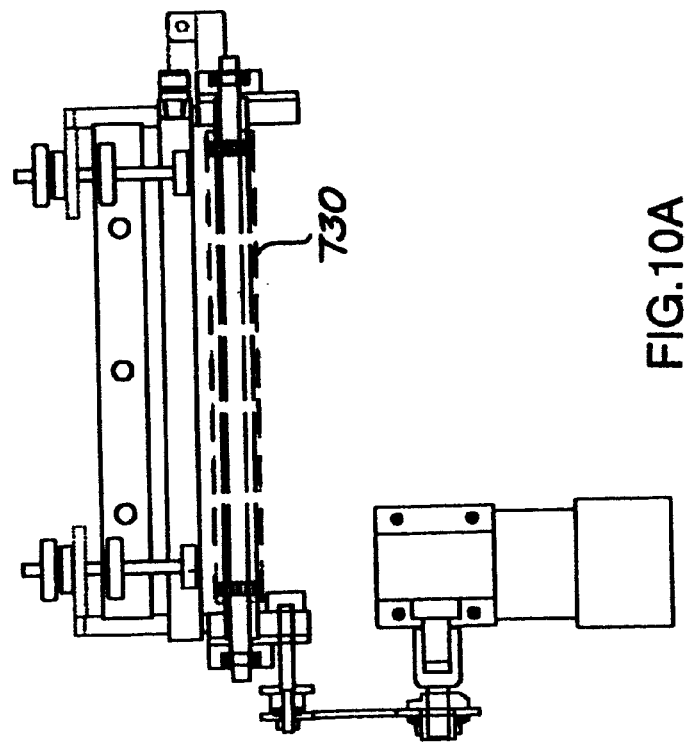

FIG. 10 shows a front cross sectional view of the same embodiment of the present invention with the top gang spray wands 710, bottom gang spray wands 720, conveyor 730 and drive motor 660 arrangement. The top spray assemblies 740 of the wash, rinse and drying sections are mounted on a rotatable hinge joint 750, and can be lifted in an angular manner for access to the devices and conveyor belt in each section for inspection.

Figure 11:
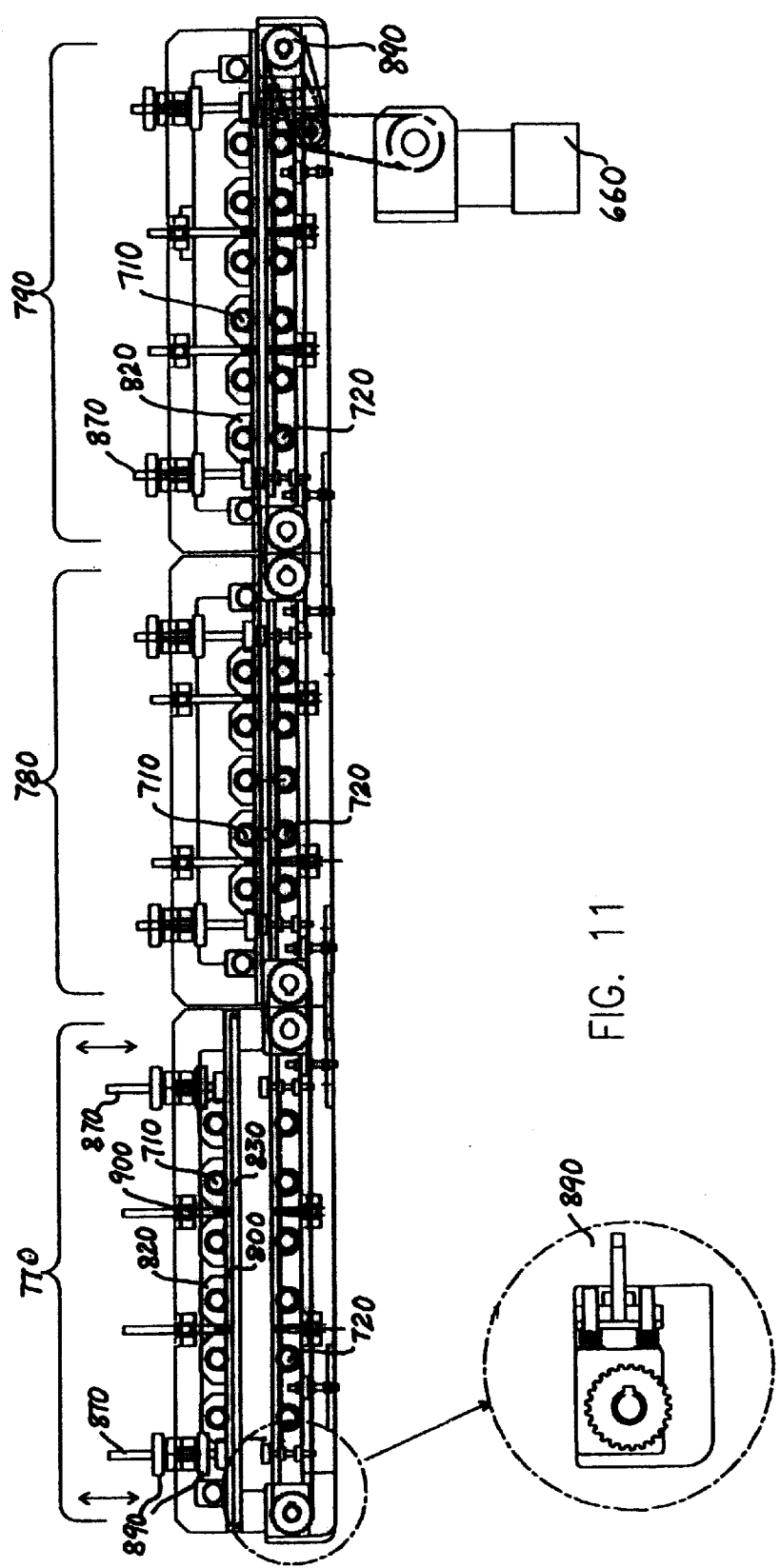
FIG. 11 is a side elevational view of the wash, rinse and drying modules according to the same embodiment of the present invention.

FIG. 11 is a side elevational view of the spray mechanism and shows the three modularly linked wash, rinse and drying sections. The wash section 770, rinse section 780 and drying section 790 comprises a set of top gang spray wands 710 and bottom gang spray wands 720. The top gang spray wands are attached to the top spray plate 800 by an individual set of mechanical stays 820, which is adapted to receive the quick change top guide plate 830. The complete top spray assembly can be adjusted vertically by a set of height adjustment screws 870 by loosening lock nuts 890. The three conveyor mesh belts are self tensioned by spring tensioning devices 890. The top spray plate is then guided in its vertical movement by sets of linear shafts and guide bearings assembly 900. In this manner, the entire top spray module can be cause to increase or decrease its vertical distance from the conveyor belt to receive devices with various height configurations.

Figure 12:
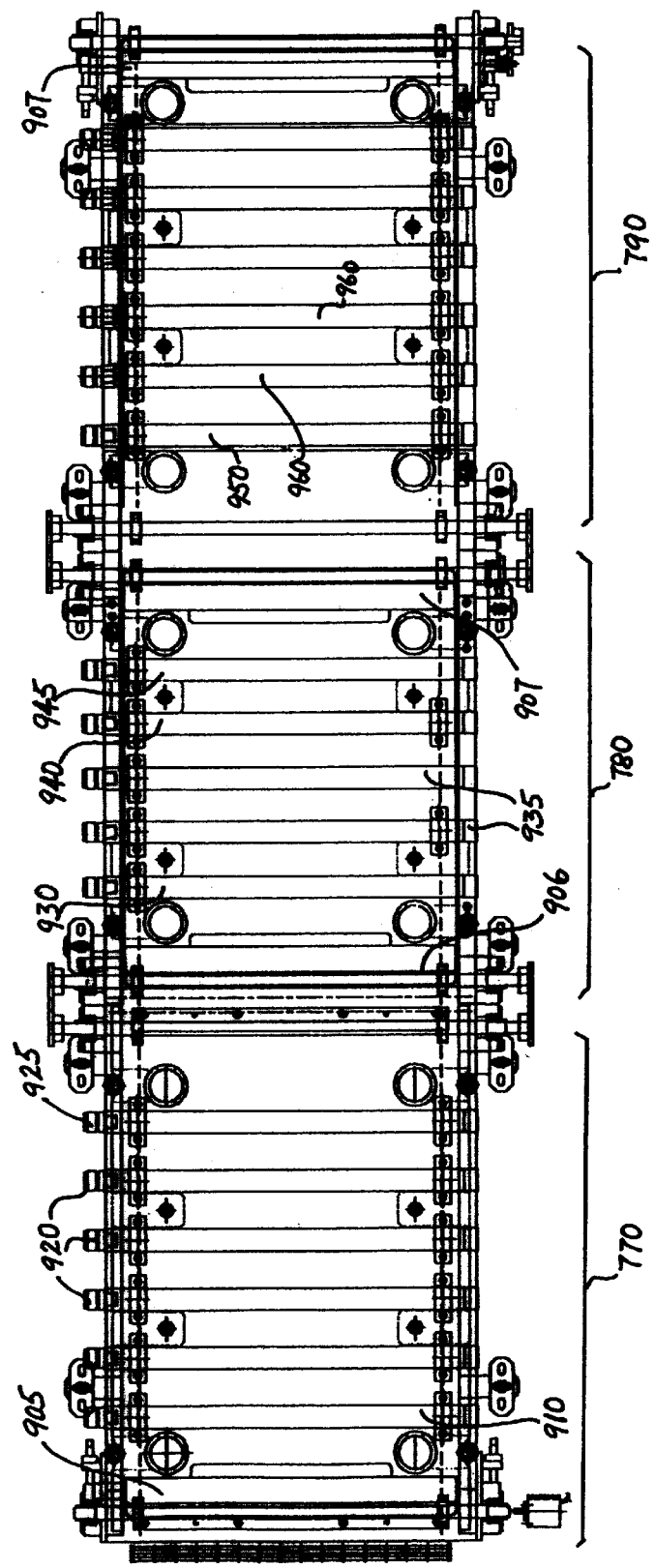
FIG. 12 is a plan view of the wash, rinse and drying modules according to the same embodiment of the present invention.

FIG. 12 is a plan view of the spray mechanism and also shows the various fluid process sections with their isolation and fume exhaust positions. The three modular sections attached to the individual modular bottom spray plate include their own independent straight mesh conveyor. The exhaust fume extraction manifold 905, the pre-wash spray 910, the wash sprays 920 and a nitrogen isolation spray 925 are integral with the first module conveyor section, and form the complete wash section 770. Exhaust manifold 906, pre-rinse spray 930, rinse spray 935, final rinse spray 940, nitrogen isolation spray 945 and exhaust extraction manifold 907 form the complete rinse section 780. Nitrogen isolation spray 950, dry air knives sprays 960 and exhaust extraction manifold 907 forms the drying section 790. The three individual conveyors are mechanically linked to each other with, for example, a chain and sprocket mechanism to provide a single synchronized speed of travel for the entire length of the cleaning apparatus.

Figure 13:
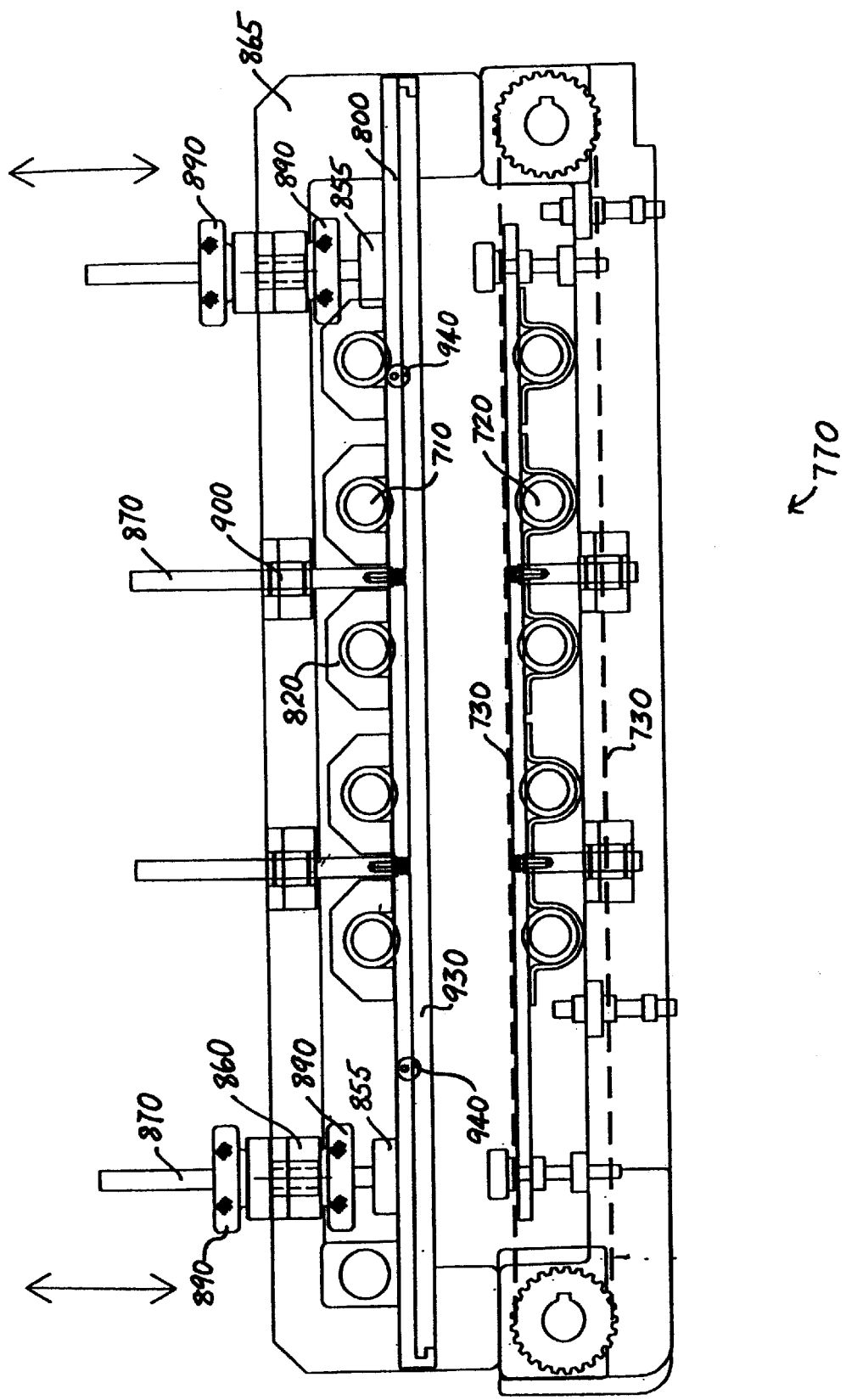
FIG. 13 is a side cross-sectional view of a single module according to another embodiment of the present invention.

FIG. 13 is a single modular section of the same embodiment according to the present invention. The top spray wands 710 are attached to the top spray plate 800 by mechanical stays 820. The top spray plate 800 in turn holds the top device multi-lane guide plate 930. The entire top spray plate 800 is then connected to the adjustment screw device 870 through brackets 855. The adjustment screw device 870 is in turn held by a bush bracket 860 on to the top frame 865. There are at least two adjustment screw device 870 for each top spray plate 800. The vertical height of the top spray plate 800 can be easily changed by rotating at least one pair of screw adjustment device 870 in unison when lock nuts 890 are released as can be seen from the top spray plate height of the wash section 770. The height adjustments can be achieved with respect to the horizontal plane of the meshed conveyor belt 730. Each top spray plate 800 receives a slidable quick change top guide plate 930 which comprises dedicated lane profile for precision land guiding of multiple strips in this particular type of high throughput cleaning apparatus. When the cleaning apparatus needs to handle devices of different widths, the top guide plate 930 can easily be dismantled by releasing one or more top locking devices 940 and sliding the entire top guide out from the front of the cleaning spray modules. Another top guide with different lane width and number of lanes can then be slotted into top spray plate 800, and lock into position with locking device 940. With this precision top lane guiding concept, the loading, transporting and unloading of the devices across the conveyor belt become efficient and precise, without the need for additional re-orientation interface apparatus nor a change in the conveyor belt system.

Figure 14:
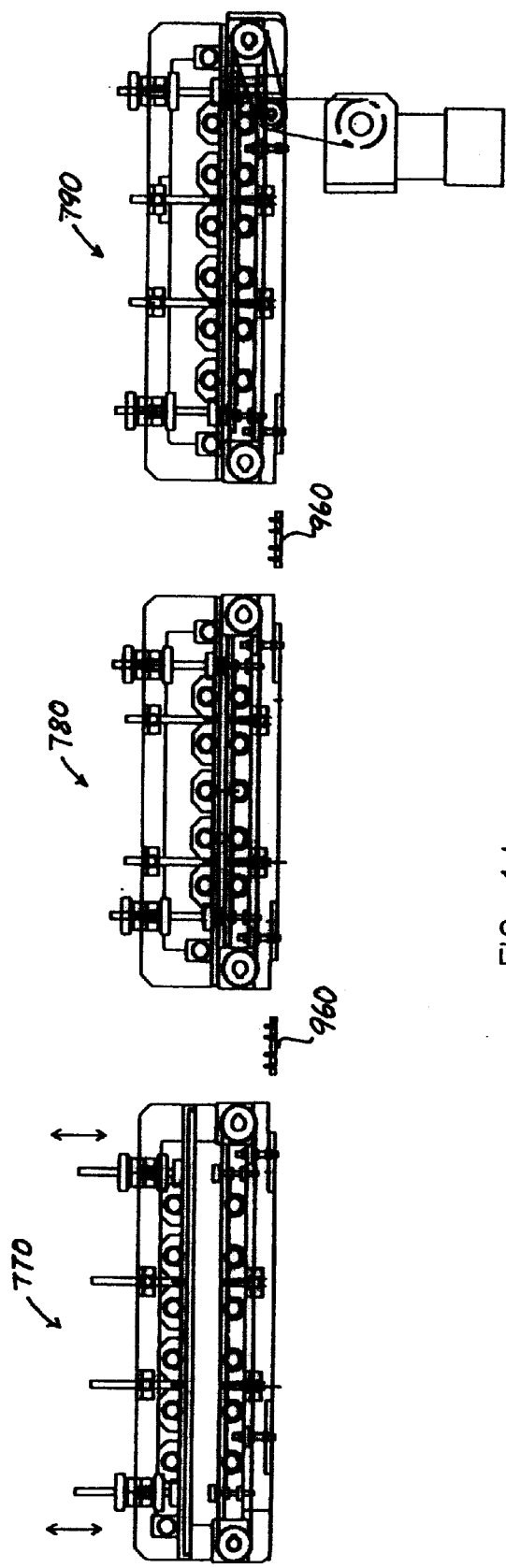
FIG. 14 is a side elevational view of the wash, rinse and drying modules showing the mechanically link jig plates.

FIG. 14A to C are the side elevational view of the wash, rinse and drying modular sections respectively, with their mechanically linked jig plate. The wash module section 770 is mechanically linked to the rinse module section 780 via a pair of jig plate 960. Similarly, the rinse module section is mechanically linked to the dry module section 790 via another pair of jig plate 960. The dry zone 790 being symmetrical in construction to the wash zone 770, can easily be interchanged to provide a left-to-right or right-to-left apparatus configuration.

Figure 15:
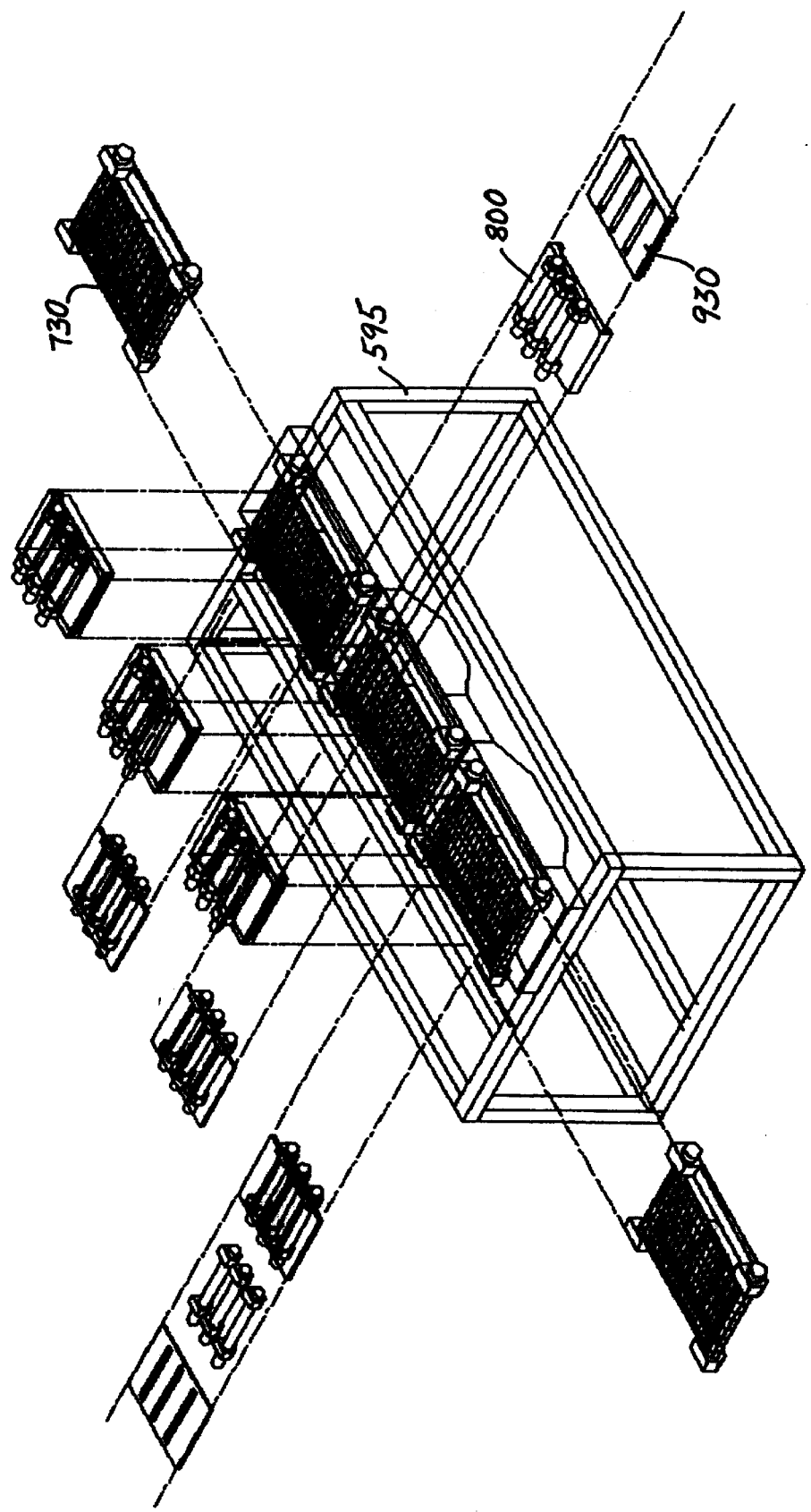
FIG. 15 is an exploded perspective showing the quick change top guide plate according to the same embodiment of the present invention.

FIG. 15 is an isometric view of the three modular sections showing the quick change top guide plate according to the one embodiment of the present invention. In this embodiment, the gang of spray wands is attached to a top spray plate 800 and integral to this plate is a slotted guide way to receive the top multi-lane guiding plate 930. As explained earlier, this multi-lane guide plate 930 provides directional guidance to devices being transported within the apparatus. By simply rotating the lock screws 940, the top multi-lane guide plate can be removed with ease and another set of multi-lane guide plate with different lane widths can be replaced to handle packages of a different width.

Figure 16:
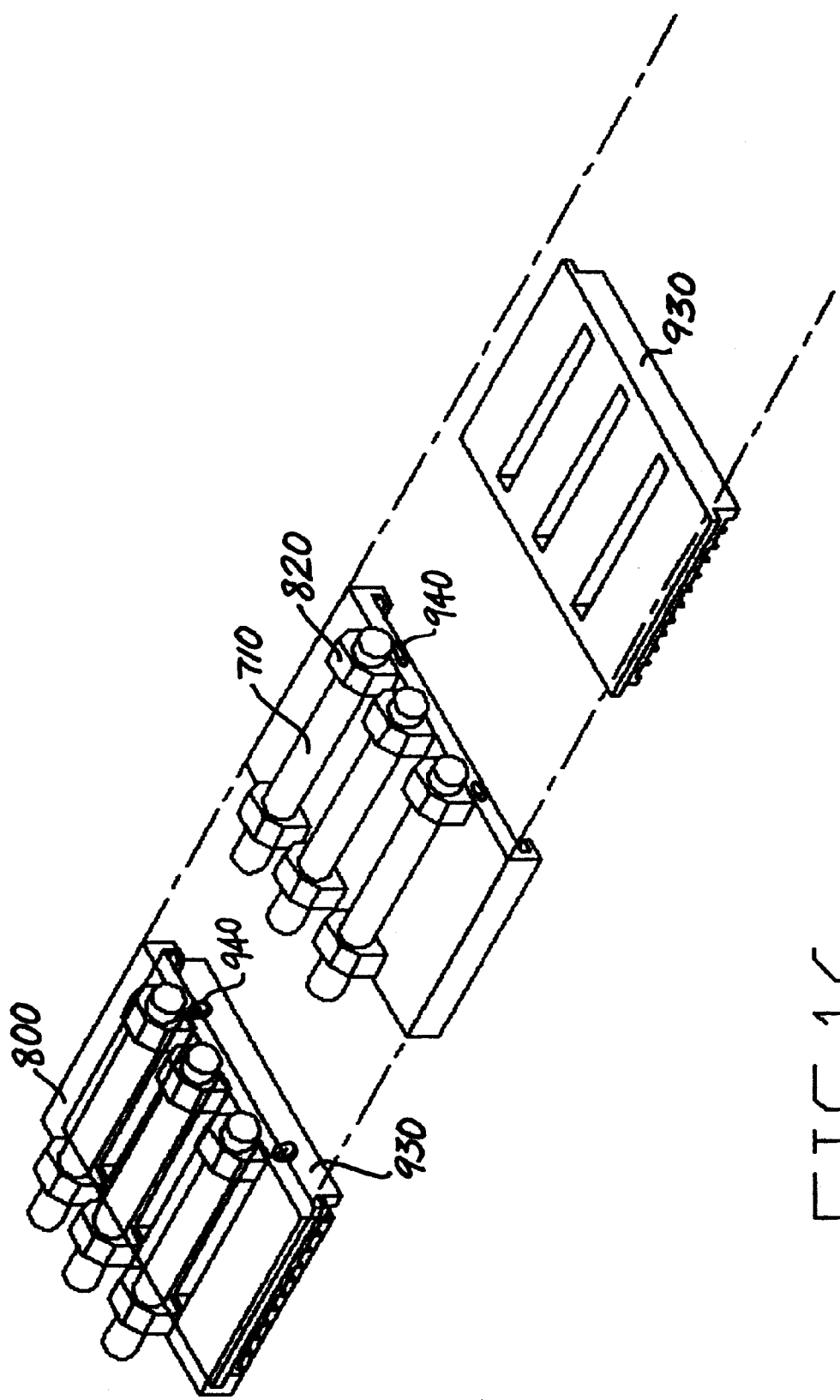
FIG. 16 is an exploded perspective view of the top spray module and the quick change top guide with its locking device according to another feature of the present invention.

FIG. 16 is an isometric view of a top spray module, showing in greater detail how the quick change top guide plate 930 with its locking devices 940 can be slidably engaged to the spray top plate 800.

Figure 17A:
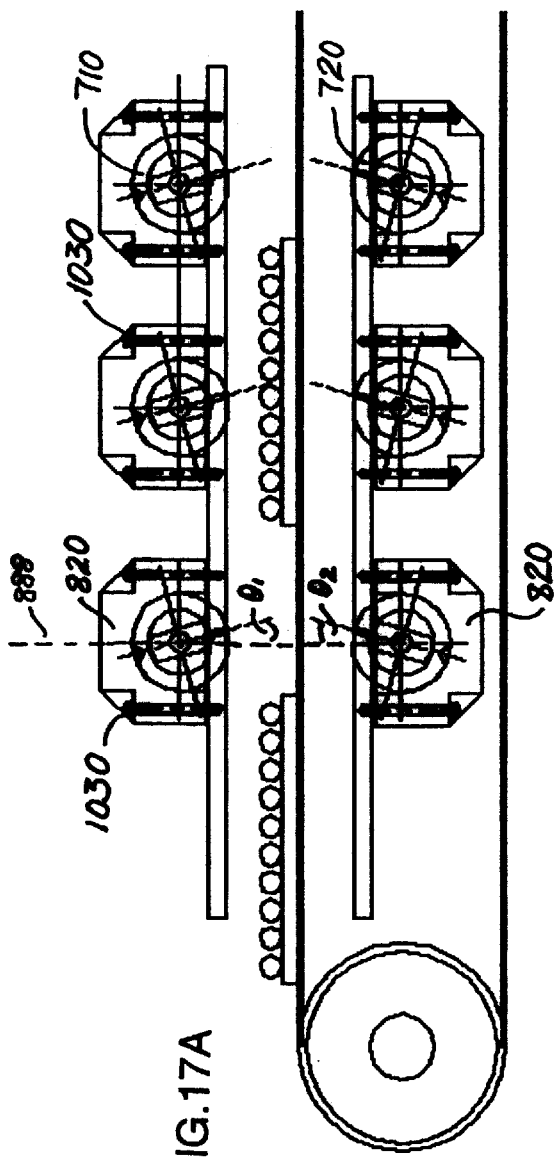
FIG. 17 is a side sectional view of the tip and bottom spray section with a graphical representation of the direction of spray adjustment feature with spray force analysis intended to create positive flow according to the present invention.
Figure 17B:
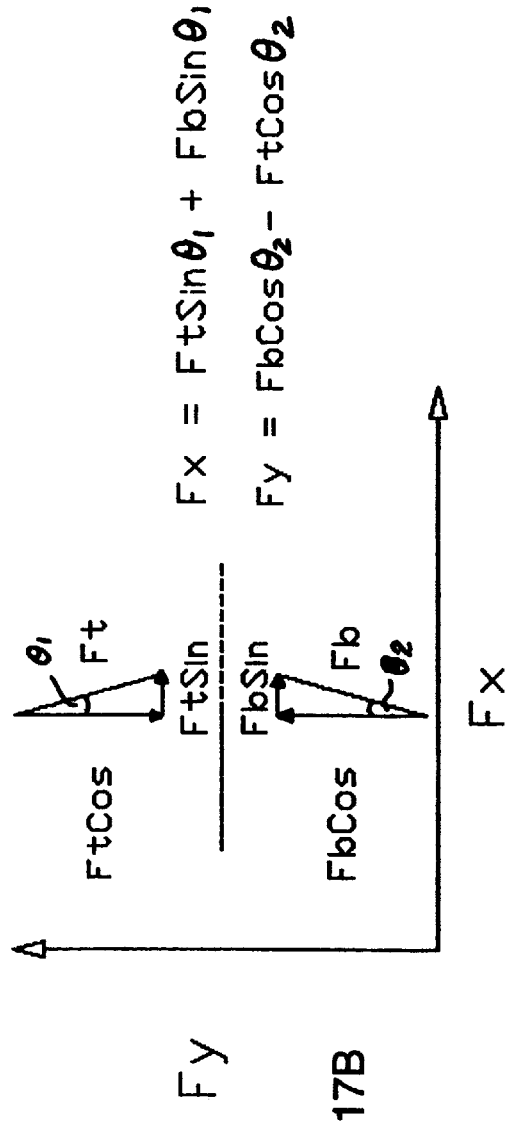

FIG. 17A is a side sectional view of the top and bottom spray sections showing how the direction of the spray can be readily adjusted. FIG. 17B is a graphical representation of the direction of spray adjustment feature and a corresponding spray force analysis. As the direction of spray (angle θ) increases with respect to the vertical axis, the vertical component of the force Fy decreases which the horizontal component Fx increases. The horizontal force, Fx, is increased to create a forward push for devices as they are washed. The top direction of spray, angle $\theta_1$, can be adjusted independently from the bottom direction of spray, angle $\theta_2$. by loosening mechanical stays 820 through screws 1030 and rotating top spray wand 710 and bottom spray wand 720 in either the clockwise or counter-clockwise direction. With both the top direction of spray and bottom direction of spray, angles $\theta_1$, and $\theta_2$, in symmetry, the resultant horizontal force component Fx of the spray jets will assist the light weight package in its direction of travel of the conveyor through the cleaning apparatus.

FIG. 18 shows an embodiment of the uniform velocity spray wand. In this example, a tapered beam is provided to reduce the cross-sectional area of fluid flow. This figure also shows the set of microtunnels on the spray wand for close pitching and effective washing of the spray jets, which is another important feature of the present invention. In this embodiment, circular conduit 1200 contains a tapered velocity balance beam 1280 which is connected via a threaded joint 1300 and is held by stay 1320 such that the tapered velocity balance beam 1280 is concentric to inner wall of the circular conduit 1200. The fluid enters from direction 1340 and moves in the inner fluid chamber space 1360 along to the microtunnels 1380 and is finally discharged as microspray jets 1400 onto device 1420. It is obvious that other equivalent shapes and designs of the spray wand may be used to achieve the same uniform fluid velocity based on the teachings disclosed herein.

FIG. 18C shows the microtunnels 1380 in a straight line layout across the conduit 1200. These microtunnels allow close pitching to be achieved and can be as close as 0.5 to 2.0 mm apart, which represent the pitching for BGA packages such as device 1420 as shown in FIG. 18B. There is no limit to the maximum distance apart. As there is no structure protruding from the surface of the spray wand, the spray wand may be shifted to a position close to the surface of the device. The microtunnels also provides a laminar fluid jet flowing directly onto the surface of balls of BGA packages, thereby maximizing the capacity of the fluid motion, ensuring optimized cleaning. FIG. 19 is a comparison of the velocity or flow discharge achievable using the tapered tunnel width spray conduit of the present invention 1700 versus a spray conduit having a constant area for fluid flow 1600 in the art. Velocity profile 1650 shown in FIG. 19C illustrates the drop in fluid velocity along the corresponding positions in conduit 1600. Velocity profile 1750 shows the corrected average fluid discharge velocity for the tapered conduit 1280. this feature according to the present invention allows constant fluid momentum needed to wash and push the residues from the device surface throughout the length of the conduit. Such consistency allows multiple devices to be placed in rows across the conduit and the cleaning quality effect achievable for all devices can be highly improved. As shown in FIG. 19, this embodiment of the present invention has no physical entity of micronozzles per se. Instead pores in the conduits function as microtunnels, which give a laminar flow effect when fluid flow from them. FIG. 19D shows how fluid flowing through microtunnel 1380 from conduit 1360 gives a liminar flow effect on the input/output lead or solder balls of a semi-conductor device such as a ball grid array device 1420. This embodiment of the present invention also uses conduits with a plurality of microtunnels to achieve a very close pitching of fine and precise sprays to enable the cleaning apparatus to achieve compact pitch cleaning capability where conventional prior art design is limited. Since nozzles generally includes a physical element, it is impossible to achieve a closely packed row of nozzles having a pitch matching that of the array packages. On the other hand, high density and extremely small pitches may be achieved with microtunnels such that each microtunnel effectively washes a corresponding lead or solder ball. Conventional techniques such as electro-discharge machining may be used to obtain straight microtunnels in high density. The internal surface of the spray wand may also be electro-polished to facilitate the use of ultra-pure deionized water (10–18 Megaohms conductivity) as the cleaning medium. Solvents and chemicals can also be used as the washing medium by utilizing resistant material for the spray wands. The spray wands can also be manufactured in sections which can be connected together, for example by spacers to form complete spray wands. The advantage of having sections is that the direction of spray may be adjusted such that different sections of the same spray wand can have different directions of spray. This gives unprecedented versatility to the cleaning apparatus, as larger objects such as printed circuit boards may possess different components soldered on in different ways which would benefit from differring washing regimes. Spacers with different thread length may be provided to accomodate different directions of spray while providing a fluid-proof joint.

The entire apparatus may be controlled by a programmable logic controller with a pump speed controller to provide constant fluid pressure to serve as the cleaning medium and thus allows precise control of the spray force dynamically. the entire cleaning apparatus is then controlled by a computer system having a monitor for supervisory control and data acquisition purposes to serve as the main sequencer to automate the apparatus. The internal software comprises a graphic user interface capable of interaction in a plurality of languages. The interface can also be activated in real time during the cleaning process without stopping the apparatus in real time. For example, the machine display software allows Chinese or English switch over on the main display.

Figure 20:
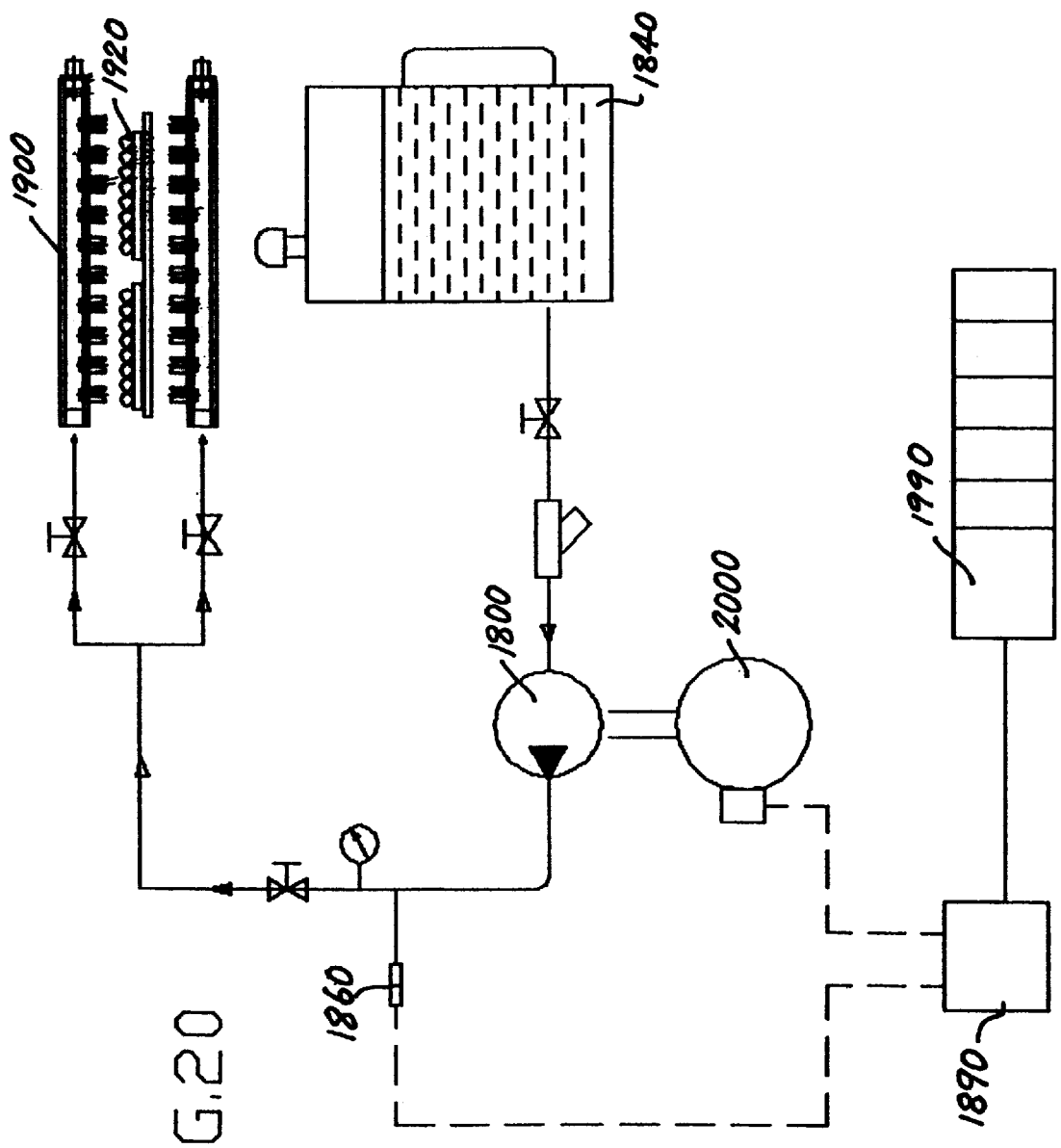
FIG. 20 is a schematic design of a constant pressure pump according to another feature of the present invention.

FIG. 20 shows an example of a constant pump pressure control system for the rows of spray wands. Without the constant pressure pump system, the fluid flow cannot automatically compensate dynamically for any sudden excursion of fluid pressure due to choked nozzles or microtunnels. The extra fluid energy will then be transferred to the other openings thereby creating a surge in fluid energy across other free and unchoked nozzles, thereby damaging the delicate surfaces of the devices under wash. In this embodiment, pump 1800 draws fluid from tank 1840 and discharges to a set of top and bottom spray wands 1900 to effect the cleaning of device 1920. On the discharge side of pump 1800, pressure sensor 1860 feedbacks electrical or electronic signals to pump motor 2000 which is coupled to pump 1800 and will sense the increase in fluid pressure when a nozzle is choked. Thus even with some nozzles being choked or blocked, the other nozzles will still maintain the same fluid discharge velocity as if all nozzles are discharging normally. The speed controller is connected to a programmable logic control 1990 which toggles motor 2000 and pump 1800 on and off when fluid is needed for cleaning.

The cleaning fluid which can be used in conjunction with the present invention may be any kind of cleaning agent, from water to solvents, as long as the material for construction of the apparatus is compatible with the chemical used. Devices which can be cleaning include BGA packages, flip chips, surface mount devices, PCMCIA, hard disk, flat panel display, liquid crystal display devices, mixed technology printed circuit boards, and electronic carrier trays. Other devices include, but are not limited to semi-conductor chips in single continuous strips, Auer boats, Jedec trays and other types of holding carrier.

While the present invention has been described particularly with references to FIGS. 8 to 20 with emphasis on a system for cleaning semi-conductor devices, it should be understood that the figures are for illustration only and should not be taken as limitation on the invention. In addition it is clear that the method and apparatus of the present invention has utility in many applications where automatic cleaning is required. It is contemplated that many other changes and modifications may be made by one of ordinary skill in the art without departing from the spirit and the scope of the invention described.

What is claimed is:

1. An apparatus for washing devices comprising:

a housing having a front end and a back end;

a conveying system disposed within said housing for transporting said devices through said apparatus, said conveying system having a receiving end proximate said front end for receiving devices, an unloading end proximate said back end for moving said devices to the exterior, a wash zone there between, at least one belt, at least one top spray wand provided above said belt with its row of holes adapted to spray downwards towards said belt, and at least one bottom spray wand provided below said conveyor belt with its row of holes directed to spray upwards towards said belt;

at least one spray wand having a first and second end affixed to said housing within said wash zone, said first end adapted for attachment to a source of fluid supply, said spray wand having at least one row of holes disposed longitudinally there across for releasing said fluid onto said devices, said spray wand further having a decreasing internal area for fluid flowing from said first end to said second end whereby pressure drop across said spray wand during washing is compensated; and a top plate hingedly attached to said housing along a plane substantially parallel to said conveyor belt whereon said top spray wands are attached, said top plate adapted to allow fluid from said row of holes to spray therethrough onto devices placed on the belt there below.

2. An apparatus according to claim 1 wherein said spray wand is divided into a plurality of traverse sections such that the direction of spray of the rows of holes in each section may be adjusted independently.

3. An apparatus according to claim 1 wherein at least one of said top and bottom spray wand is divided into a plurality of traverse sections such that the direction of spray of the rows of holes in each section may be adjusted independently.

4. An apparatus according to claim 3 wherein a spacer is provided between each section such that a leak proof joint is provided while allowing the direction of spray of the rows of holes to be independently adjustable.

5. An apparatus according to claim 3 wherein at least two grooves are provided around the exterior surface of said spray wand, one groove proximate the first end and one groove proximate the second end such that liquid traveling longitudinally along said wand will collect at and drip down from said groove.

6. An apparatus according to claim 1 further comprising height adjustment means provided in said housing for adjusting the distance between said top spray wand and the belt.

7. An apparatus according to claim 1 further comprising height adjustment means provided in said housing for adjusting the distance between said bottom spray wand and said belt.

8. An apparatus according to claim 1 further comprising a drying zone proximate said back end wherein a dryer is disposed for drying said devices after washing.

9. An apparatus according to claim further comprising:

a second housing having a second front end and a second back end, said second housing mechanically linked to said housing;

a second conveying system disposed within said second housing for transporting said devices through said second housing, said second conveying system having a dryer receiving end proximate said second front end for receiving devices from said unloading end, a dryer unloading end proximate said second back end for moving said devices onwards, and a drying zone therebetween; and at least one dryer disposed within said drying zone for drying said device after washing.

10. An apparatus according to claim 9 wherein said dryer further comprises at least one drying tube with pores disposed longitudinally thereon and a heating element disposed therein, said drying tube disposed axially to the conveying direction such that drying fluid flowing from said pores are directed to the devices on said belt therebelow.

11. An apparatus according to claim 10 wherein a plurality of drying tubes are provided, and the temperature of said heating elements within different drying tubes are controlled such that a device traveling across said drying zone experiences a gradual increase in temperature until a maximum drying temperature is reached.

12. An apparatus according to claim 10 wherein additional drying slots and drying tubes are provided and individually controlled in temperature such that said device further experiences a gradual decrease in temperature after the maximum drying temperature is reached.

13. An apparatus according to claim 10 wherein said drying tubes have an inlet and an outlet, said inlet connected to a compressed air source such that air is heated up by said heating element and blown onto said devices through said rows of holes.

14. An apparatus according to claim 1 wherein a guiding member, attached to said housing, is provided for maintaining a predetermined path of travel of said devices on said conveying system.

15. An apparatus according to claim 14 wherein a guiding member, engaged to and below the top plate, is provided for maintaining a predetermined path of travel of said devices on said conveying system.

16. An apparatus according to claim 15 wherein said guiding member comprises a guiding plate with longitudinal tracks for guiding said devices along a straight conveying path, said guiding plate further provided with openings to allow spray fluid from said rows of holes to reach said devices therethrough.

17. An apparatus according to claim 1 wherein said holes on said spray wand are microtunnels.

18. An apparatus according to claim 1 wherein said holes on said spray wand are microtunnels of 0.1 mm to 1.5 mm diameter.

19. An apparatus according to claim 1 wherein said holes on said spray wand are microtunnels which are spaced at a distance of 1.0 to 1.5 mm apart.

20. An apparatus according to claim 1 further comprising a constant pressure pump connected to said fluid source.

21. An apparatus according to claim 1 further comprising a computer system for controlling the washing apparatus.

22. An apparatus according to claim 1 wherein the inner surface of said spray wand is electro-polished for maintaining cleanliness of said fluid.

23. An apparatus according to claim 1 wherein said spray wand further comprises an internal-tapered bar disposed longitudinally, said tapered bar having a increasing traverse cross-sectional area from the first end to the second end of said spray wand.

24. An apparatus according to claim 1 wherein said spray wand is cylindrical, and further comprises an internal conical bar disposed longitudinally, said conical bar having a increasing traverse cross-sectional area from the first end to the second end of said spray wand.

25. An apparatus according to claim 1 wherein said spray wand further comprises an internal tapered bar disposed longitudinally, said tapered bar having a increasing traverse cross-sectional area from the first end to the second end of said spray wand.

26. An apparatus according to claim 1 wherein said spray wand further comprises an internal tapered bar disposed longitudinally, said tapered bar having a increasing traverse cross-sectional area from the first end to the second end of said spray wand, the outer surface of said tapered bar and the inner surface of said spray wand is electro-polished to maintain cleanliness of said fluid.

27. An apparatus for washing devices comprising:

a housing having a front end and a back end;

a conveying system disposed within said housing for transporting said devices through said apparatus, said conveying system having a receiving end proximate said front end for receiving devices, an unloading end proximate said back end for moving said devices to the exterior, a wash zone there between, and at least one belt;

at least one spray wand having a first and second end affixed to said housing within said wash zone, said first end adapted for attachment to a source of fluid supply, said spray wand having at least one row of holes disposed longitudinally there across for releasing said fluid onto said devices, said spray wand further having a decreasing internal area for fluid flowing from said first end to said second end whereby pressure drop across said spray wand during washing is compensated;

a second housing having a second front end and a second back end, said second housing mechanically linked to said housing;

a second conveying system disposed within said second housing for transporting said devices through said second housing, said second conveying system having a dryer receiving end proximate said second front end for receiving devices from said unloading end, a dryer unloading end proximate said second back end for moving said devices onwards, and a drying zone therebetween; and at least one dryer disposed within said drying zone for drying said device after washing, said dryer comprising a plurality of drying tubes with pores disposed longitudinally thereon and a heating element disposed therein, said drying tubes disposed axially to the conveying direction such that drying fluid flowing from said pores is directed to the devices on said belt therebelow, the temperature of said heating elements within different drying tubes being controlled such that a device traveling across said drying zone experiences a gradual increase in temperature until a maximum drying temperature is reached.

28. An apparatus for washing devices comprising:

a housing having a front end and a back end;

a conveying system disposed within said housing for transporting said devices through said apparatus, said conveying system having a receiving end proximate said front end for receiving devices, an unloading end proximate said back end for moving said devices to the exterior, a wash zone there between, and at least one belt;

at least one spray wand having a first and second end affixed to said housing within said wash zone, said first end adapted for attachment to a source of fluid supply, said spray wand having at least one row of holes disposed longitudinally there across for releasing said fluid onto said devices, said spray wand further having a decreasing internal area for fluid flowing from said first end to said second end whereby pressure drop across said spray wand during washing is compensated;

a second housing having a second front end and a second back end, said second housing mechanically linked to said housing;

a second conveying system disposed within said second housing for transporting said devices through said second housing, said second conveying system having a dryer receiving end proximate said second front end for receiving devices from said unloading end, a dryer unloading end proximate said second back end for moving said devices onwards, and a drying zone therebetween; and at least one dryer disposed within said drying zone for drying said device after washing, said dryer comprising at least one drying tube with pores disposed longitudinally thereon and a heating element disposed therein, said drying tubes disposed axially to the conveying direction such that drying fluid flowing from said pores is directed to the devices on said belt therebelow, wherein additional drying slots and drying tubes are provided and individually controlled in temperature such that said device further experiences a gradual decrease in temperature after the maximum drying temperature is reached.

* * * * *